(12) United States Patent
Tseng et al.

(10) Patent No.: US 7,580,258 B2
(45) Date of Patent: Aug. 25, 2009

(54) DISPLAY APPARATUS

(75) Inventors: Tsung-Chi Tseng, Hsin-Chu (TW); Hui-Ling Chao, Hsin-Chu (TW)

(73) Assignee: Coretronic Corporation, Hsin-chu (TW)

( * ) Notice: Subject to any disclaimer, the term of this patent is extended or adjusted under 35 U.S.C. 154(b) by 0 days.

(21) Appl. No.: 12/110,337

(22) Filed: Apr. 27, 2008

(65) Prior Publication Data
US 2009/0175002 A1  Jul. 9, 2009

(30) Foreign Application Priority Data
Jan. 3, 2008    (TW) .................................. 97100189

(51) Int. Cl.
*H05K 7/20* (2006.01)
(52) U.S. Cl. .................. 361/690; 361/679.21; 313/582; 349/58; 349/161
(58) Field of Classification Search ................. 361/681, 361/679.21, 688, 695; 313/582; 349/58, 349/60, 161
See application file for complete search history.

(56) References Cited

U.S. PATENT DOCUMENTS

| | | | | |
|---|---|---|---|---|
| 5,108,470 A * | 4/1992 | Pick | ............................. | 96/58 |
| 5,464,461 A * | 11/1995 | Whitson et al. | ............... | 55/493 |
| 6,697,250 B2 * | 2/2004 | Kuo | ............................. | 361/681 |
| 6,764,533 B2 * | 7/2004 | Lobiondo, Jr. | ............... | 55/493 |
| 6,843,820 B2 * | 1/2005 | Kubokawa | .................... | 55/495 |
| 6,860,916 B2 * | 3/2005 | Kubokawa et al. | ............ | 55/495 |
| 7,092,248 B2 * | 8/2006 | Shu | ............................. | 361/681 |
| 2004/0003718 A1 * | 1/2004 | Milano | ........................ | 55/506 |
| 2004/0065067 A1 * | 4/2004 | Chen et al. | .................... | 55/493 |
| 2005/0247037 A1 * | 11/2005 | Chen et al. | .................... | 55/495 |
| 2006/0132669 A1 * | 6/2006 | Liou et al. | .................... | 349/58 |
| 2006/0164804 A1 * | 7/2006 | Kim et al. | .................... | 361/688 |
| 2006/0266013 A1 * | 11/2006 | Tseng et al. | .................. | 55/486 |
| 2006/0290812 A1 * | 12/2006 | Hsu | ............................ | 361/681 |
| 2007/0064388 A1 * | 3/2007 | Uchizono et al. | ........... | 361/681 |
| 2007/0103866 A1 * | 5/2007 | Park | ............................ | 361/687 |
| 2008/0088573 A1 * | 4/2008 | Kim | ............................ | 345/102 |
| 2008/0218446 A1 * | 9/2008 | Yamanaka | .................. | 361/695 |
| 2008/0239634 A1 * | 10/2008 | Nakao et al. | ................ | 361/681 |

* cited by examiner

*Primary Examiner*—Jayprakash N Gandhi
*Assistant Examiner*—Adrian S Wilson
(74) *Attorney, Agent, or Firm*—Jianq Chyun IP Office

(57) ABSTRACT

A display apparatus includes a casing, a display module, a cooling device, and a dust-proof device. The casing has first and second openings. The display module disposed in the casing has a display area exposed by the first opening and a non-display area corresponding to the second opening. The cooling device disposed at the non-display area in the casing has an air inlet corresponding to the second opening. The dust-proof device includes a body disposed at the non-display area in the casing, a cover disposed at the body, and a dust-proof element disposed therebetween. The body has first holes corresponding to the air inlet. The second opening exposes second holes of the cover. Each second hole overlaps at least one of the first holes. An airflow produced by the cooling device flows through the second opening, the second holes, the dust-proof element, the first holes, and the air inlet.

8 Claims, 7 Drawing Sheets

DISPLAY APPARATUS

CROSS-REFERENCE TO RELATED APPLICATION

This application claims the priority benefit of Taiwan application serial no. 97100189, filed on Jan. 3, 2008. The entirety of the above-mentioned patent application is hereby incorporated by reference herein and made a part of specification.

BACKGROUND OF THE INVENTION

1. Field of the Invention

The present invention generally relates to a display apparatus, in particular, to a display apparatus having a dust-proof device.

2. Description of Related Art

In recent years, with the rapid development of technologies related to the display apparatuses, display performance of the display apparatuses is progressively advanced (e.g. the improvement of the brightness of the display apparatuses), and heat generation rates of electronic elements in the display apparatuses are continuously increased. In order to prevent the electronic elements inside the display apparatuses from overheating which causes temporary or permanent breakdown, the heat dissipation performed to the electronic elements inside the display apparatuses becomes more important.

As for a display apparatus with high brightness, fans are added inside the display apparatus to enhance the heat dissipation performance of the display apparatus, which is a common heat dissipation manner to perform the forced convection. In the conventional art, a casing of the display apparatus has a plurality of holes at an area corresponding to the fan. However, in order to comply with the safety standard (e.g. including the dust-proof regulation and the prevention of user-initiated attempts to put fingers into the interior of the display apparatus through the holes), sizes of the holes are restricted, such that on the whole, an open ratio of the casing of the display apparatus is lower and accordingly the intake air amount is insufficient.

In view of the above, researchers devote themselves to finding solutions of modifying the design of the holes of the conventional display apparatus and improving the open ratio so as to increase the intake air amount.

SUMMARY OF THE INVENTION

The present invention is directed to a display apparatus having a higher open ratio and complying with the safety standard.

An embodiment of the present invention provides a display apparatus which includes a casing, a display module, a cooling device, and a dust-proof device. The casing has a first opening and a second opening. The display module is disposed in the casing and has a display area and a non-display area. The first opening exposes the display area, and the second opening is corresponding to the non-display area. The cooling device is disposed at the non-display area in the casing, and the cooling device has an air inlet corresponding to the second opening, and is capable of producing an airflow.

The dust-proof device includes a body, a cover, and a dust-proof element. The body is disposed at the non-display area in the casing. The body has a plurality of first holes corresponding to the air inlet. The cover is disposed at the body, and has a plurality of second holes. The second opening exposes the second holes, and each second hole overlaps at least one of the first holes. The dust-proof element is disposed between the body and the cover, and the airflow flows through the second opening, the second holes, the dust-proof element, the first holes, and the air inlet to flow into the interior of the cooling device.

The cover of the dust-proof device is disposed on the body of the dust-proof device, each second hole of the cover overlaps at least one of the first holes of the body and the dust-proof element is disposed between the body and the cover. Therefore, as compared with the conventional art, the display apparatus of the embodiment of the present invention complies with the safety standard, and has a higher open ratio to improve the intake air amount of the airflow.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components is between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
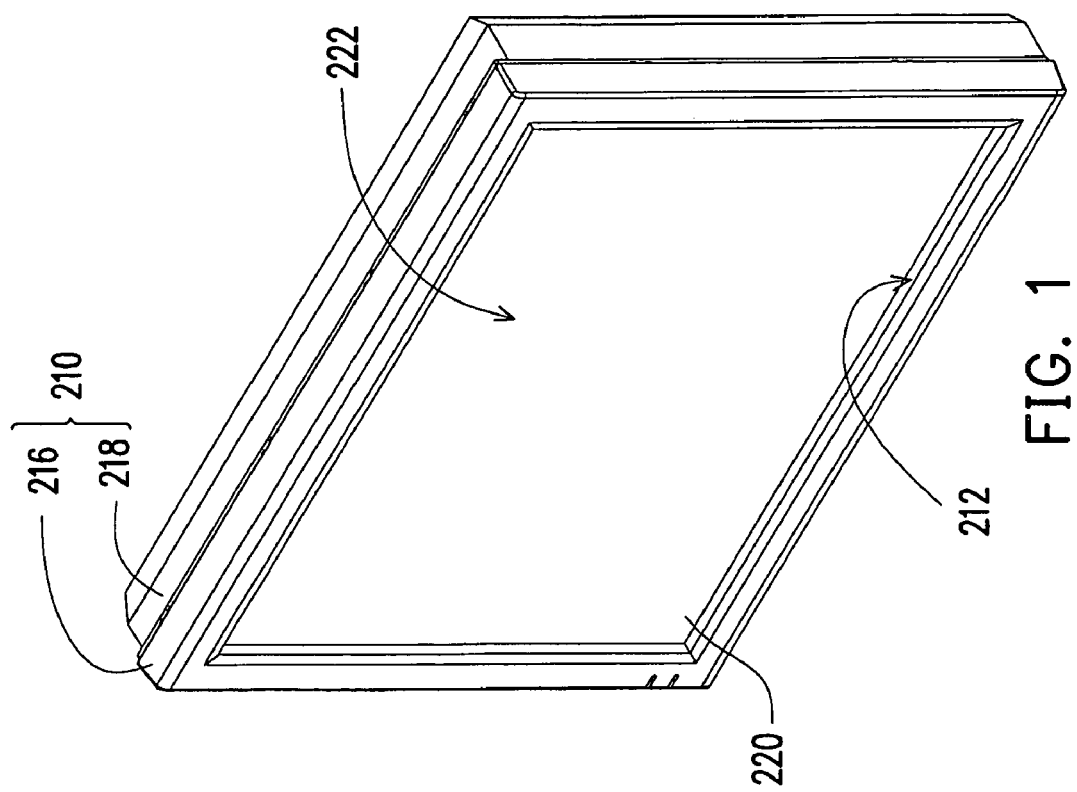
FIG. 1 is a schematic three-dimensional view of a display apparatus according to an embodiment of the present invention.
Figure 2:
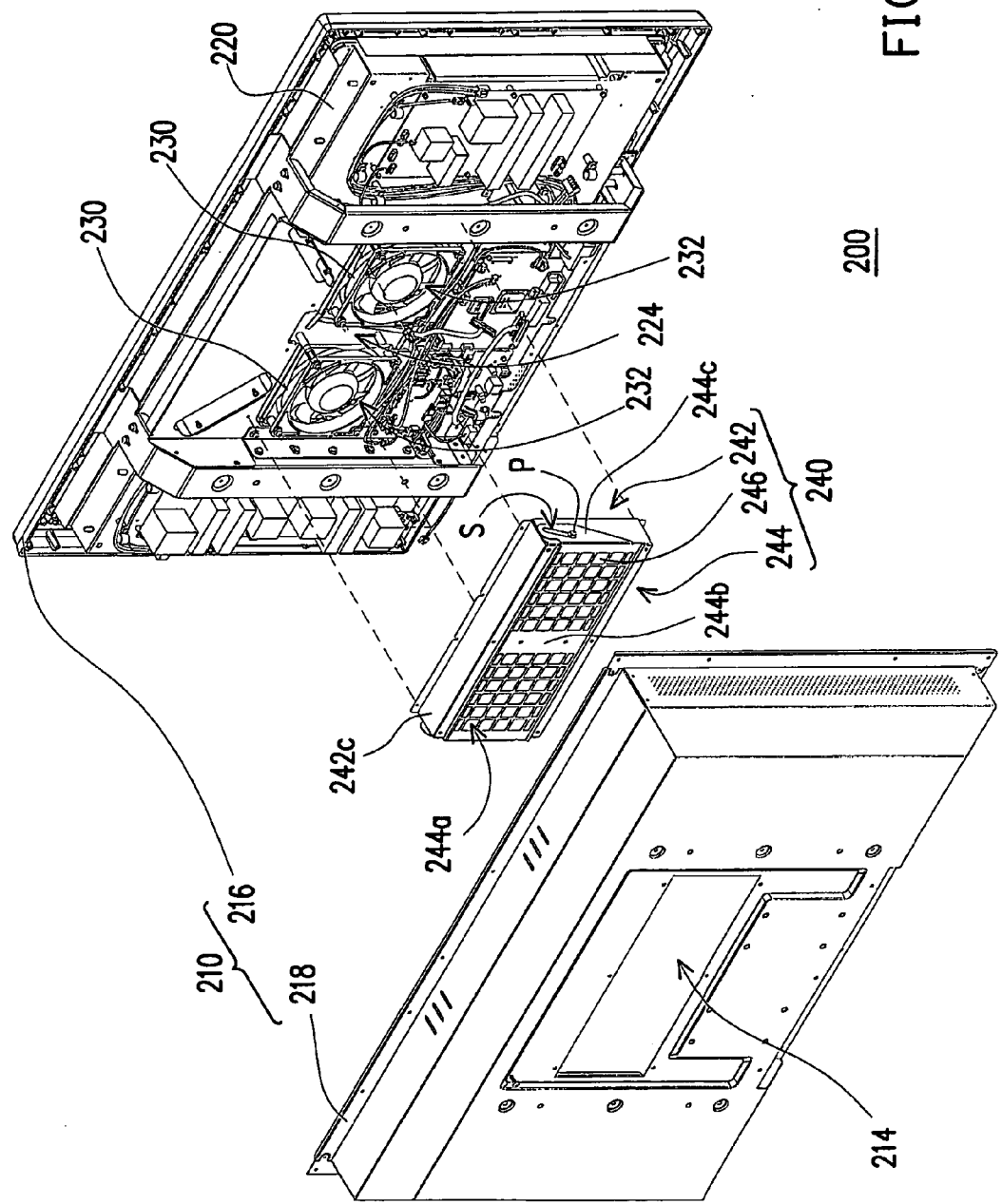
FIG. 2 is a schematic, partially exploded, three-dimensional view of the display apparatus of FIG. 1.

FIG. 1 is a schematic three-dimensional view of a display apparatus according to an embodiment of the present invention, and FIG. 2 is a schematic, partially exploded, three-dimensional view of the display apparatus of FIG. 1. Referring to FIGS. 1 and 2, a display apparatus 200 (e.g. a liquid crystal display) of this embodiment includes a casing 210, a display module 220, at least one cooling device 230 (two cooling devices 230 schematically shown in FIG. 2), and a dust-proof device 240. The casing 210 has a first opening 212 and a second opening 214. The display module 220 is disposed in the casing 210 and has a display area 222 and a non-display area 224. The first opening 212 exposes the display area 222, and the second opening 214 is corresponding to the non-display area 224.

In this embodiment, the casing 210 includes a frame 216 and a cover 218. The frame 216 surrounds the display area 222 of the display module 220, such that the first opening 212 formed on the frame 216 exposes the display area 222. In addition, the cover 218 may be assembled on the frame 216 by means of screws, such that the display module 220 is disposed in the casing 210 and the second opening 214 of the cover 218 is corresponding to the non-display area 224.

Figure 3:
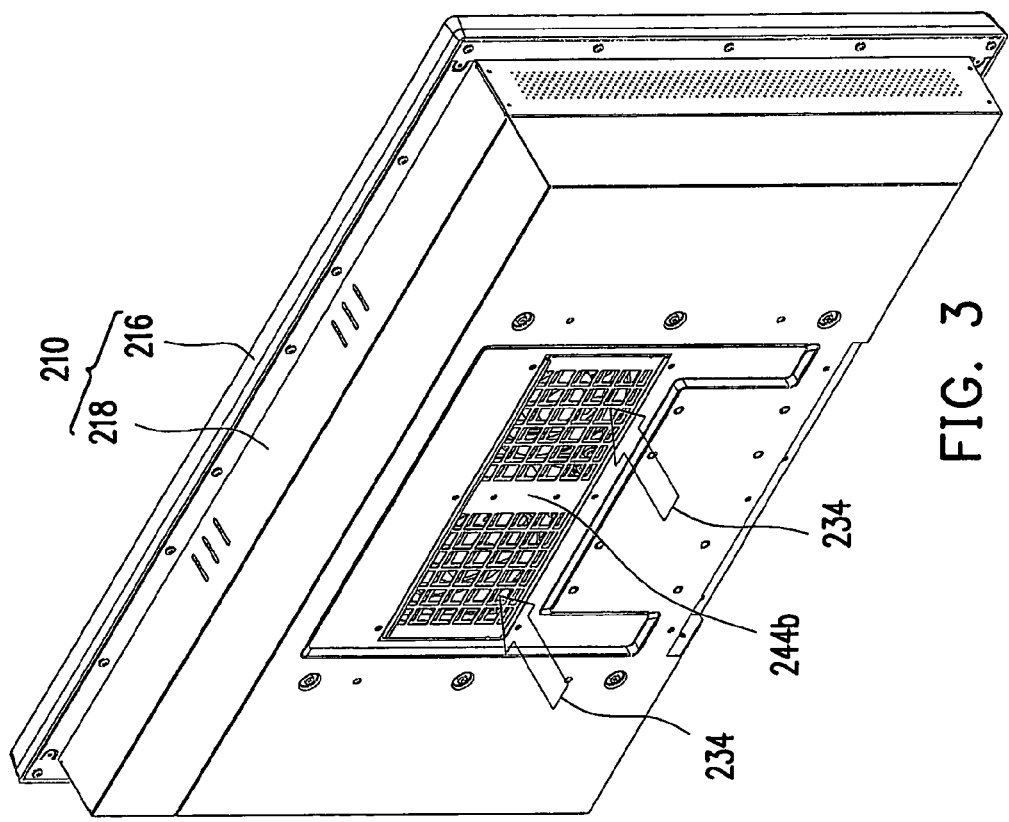
FIG. 3 is another schematic three-dimensional view of the display apparatus of FIG. 1.

FIG. 3 is another schematic three-dimensional view of the display apparatus of FIG. 1. It should be explained that for the convenience of illustration, part of the components of display apparatus 200 of FIG. 3 are not depicted (with details described below). Referring to FIGS. 2 and 3, the cooling devices 230, e.g. axial fans, are disposed at the non-display area 224 in the casing 210. Each cooling device 230 has an air inlet 232 corresponding to the second opening 214 of the casing 210.

Figure 4:
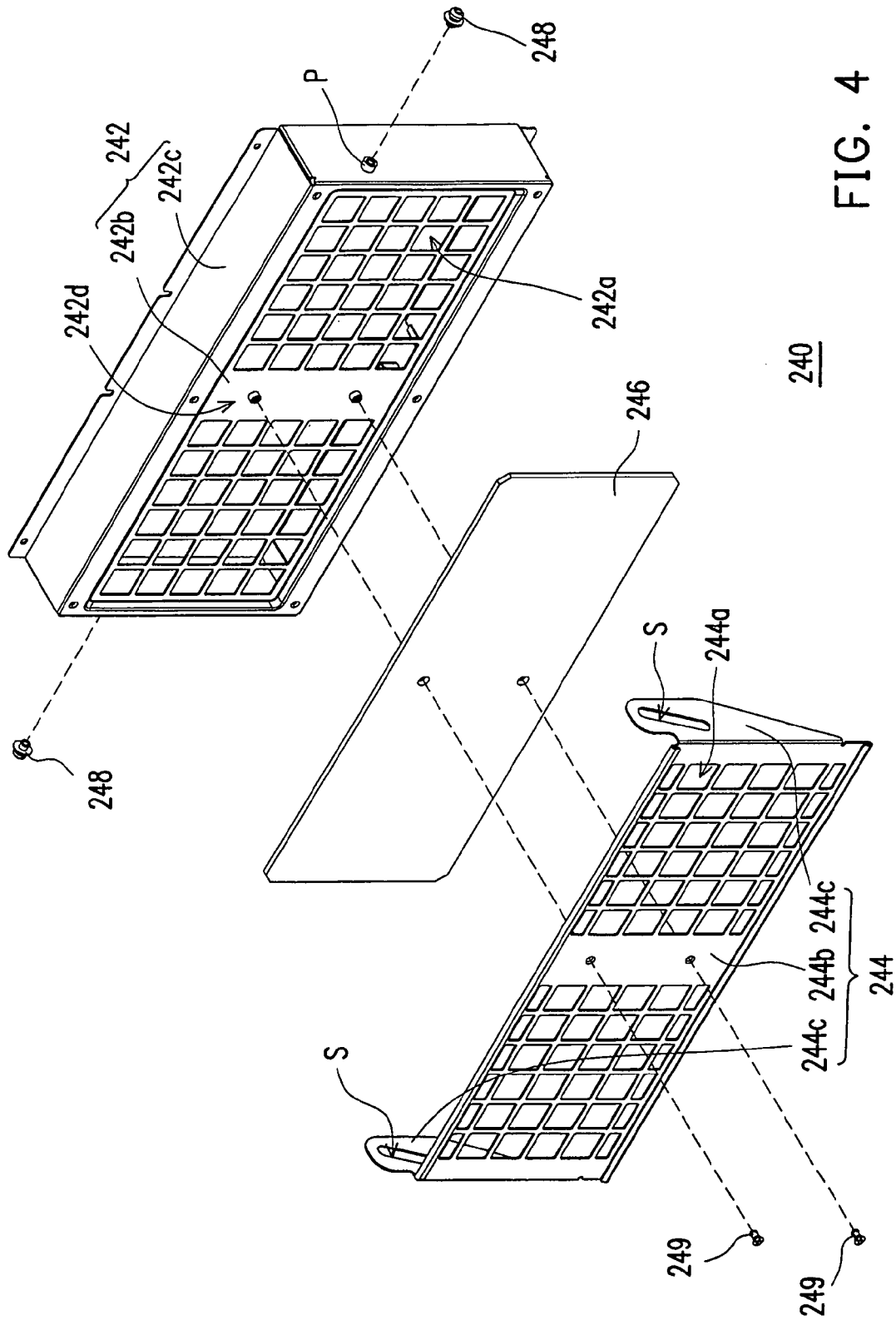
FIG. 4 is a schematic exploded three-dimensional view of a dust-proof device of FIG. 2.

FIG. 4 is a schematic exploded three-dimensional view of the dust-proof device of FIG. 2. Referring to FIGS. 2, 3, and 4, the dust-proof device 240 includes a body 242, a cover 244, and a dust-proof element 246 (the dust-proof element 246 is not shown in FIG. 3). The dust-proof element 246 (e.g. a dust-proof sheet) is disposed between the body 242 and the cover 244. The body 242 is disposed at the non-display area 224 in the casing 210. The body 242 has a plurality of first holes 242a corresponding to the air inlets 232 of the cooling devices 230. In this embodiment, the body 242 includes a first window frame portion 242b and a ring portion 242c. The first holes 242a are formed on the first window frame portion 242b, the first window frame portion 242b is connected to the ring portion 242c, and the cooling devices 230 are located in the body 242.

The cover 244 of the dust-proof device 240 is disposed at the body 242 and has a plurality of second holes 244a. The second opening 214 of the casing 210 exposes the second holes 244a. In this embodiment, the cover 244 includes a second window frame portion 244b and two opposite side boards 244c. The second holes 244a are formed on the second window frame portion 244b, and the second window frame portion 244b is connected to the side boards 244c. Each side board 244c is slidingly disposed at the ring portion 242c of the body 242. In detail, each side board 244c of the cover 244 has a slide rail S, and the ring portion 242c of the body 242 has two protrusions P. The protrusions P respectively pass through the slide rails S, and two fixing elements 248 (e.g. screws) are respectively fixed in the protrusions P, such that each side board 244c is slidingly disposed at the ring portion 242c of the body 242. In addition, the second window frame portion 244b is fixed on the first window frame portion 242b through a plurality of additional fixing elements 249 (e.g. screws).

Figure 5:
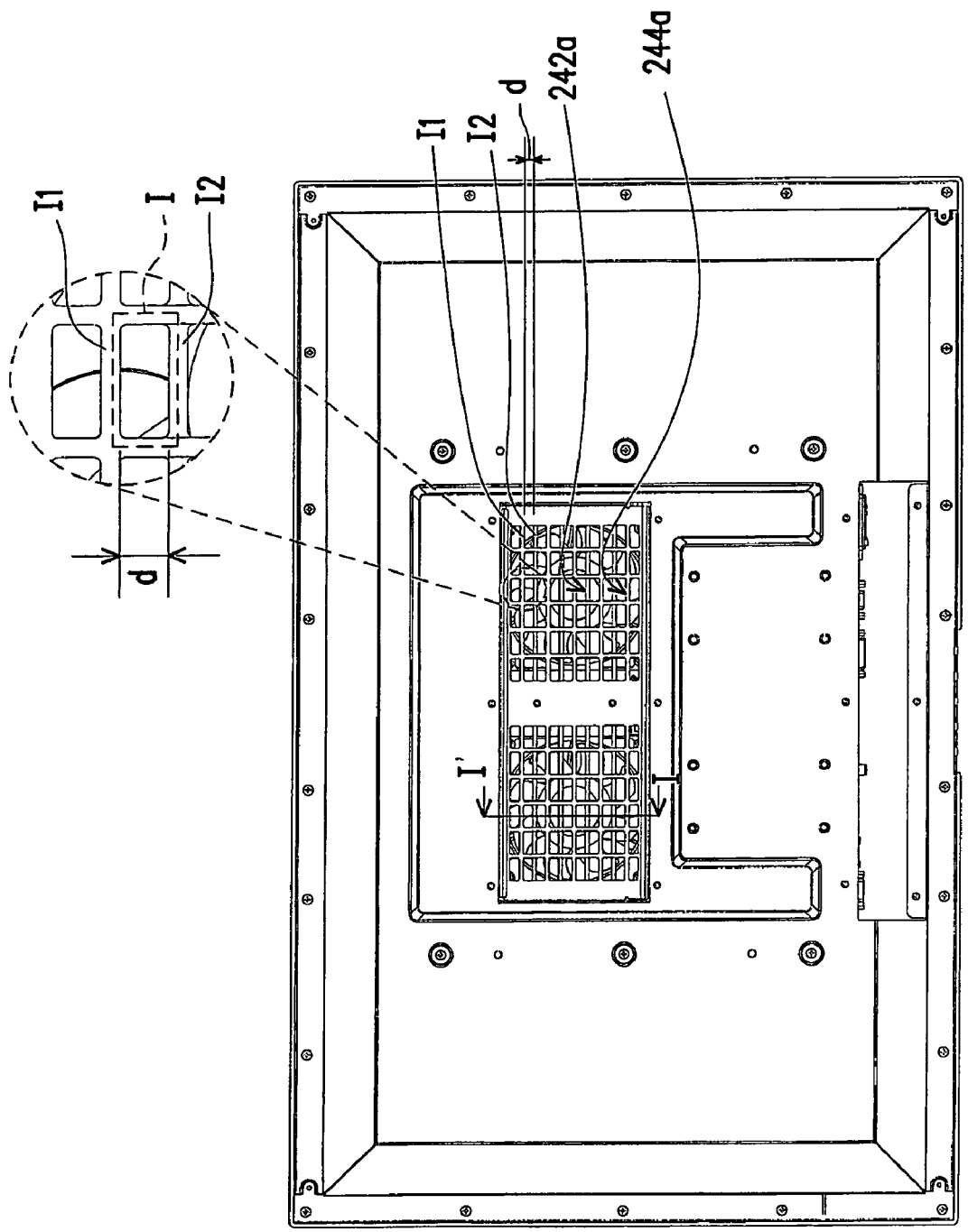
FIG. 5 is a schematic side view of the display apparatus of FIG. 1.

FIG. 5 is a schematic side view of the display apparatus of FIG. 1. It should be explained that for the convenience of illustration, the dust-proof element 246 of the display apparatus of FIG. 5 is not shown. Referring to FIGS. 3, 4, and 5, each second hole 244a overlaps at least one of the first holes 242a. In detail, the body 242 further has a surface 242d. The first holes 242a are formed on the surface 242d, each first hole 242a is a rectangular hole, and each second hole 244a is a rectangular hole. The orthogonal projections of the second holes 244a on the surface 242d and the first holes 242a form a plurality of interlaced holes I, and the shortest distance d between the two opposite edges 11 and 12 of each interlaced hole I is smaller than 12 mm. Thus, the fingers of the user are not capable of reaching the interior of the display apparatus 200 through the interlaced holes I at will such that the display apparatus 200 of this embodiment complies with the requirement prescribed in the safety standard that the fingers of the user are prevented from reaching the interior of the display apparatus 200.

Figure 6:
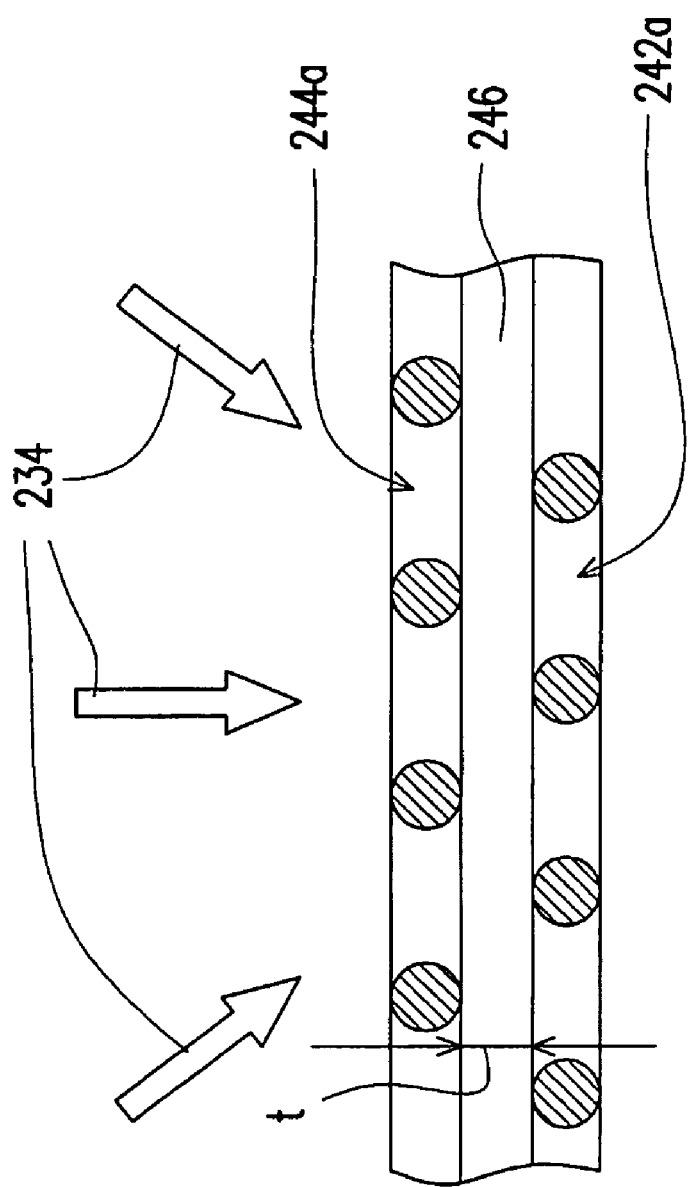
FIG. 6 is a schematic cross-sectional view of the dust-proof device of FIG. 5 taken along a line I-I'.

Hereinafter, the operation processes of the cooling devices 230 of this embodiment are illustrated. FIG. 6 is a schematic cross-sectional view of the dust-proof device of FIG. 5 taken along a line I-I'. Referring to FIGS. 3, 4, and 6, each cooling device 230 is capable of producing an airflow 234. Each airflow 234, for example, sequentially flows through the second opening 214 of the casing (as shown in FIG. 2), the second holes 244a of the cover 244 of the dust-proof device 240, the dust-proof elements 246 of the dust-proof device 240, the first holes 242a of the body 242 of the dust-proof device 240, and the air inlet 232 of the corresponding cooling device 230 (as shown in FIG. 2) to flow into the interior of the corresponding cooling device 230. Thus, the airflows 234 are capable of dissipating the heat generated by the electronic elements of the display apparatus 200 (as shown in FIG. 2, but not marked).

The dust-proof element 246 is disposed between the body 242 and the cover 244, and each airflow 234 flows through the second opening 214, the second holes 244a, the dust-proof element 246, the first holes 242a, and the corresponding air inlet 232 to flow into the interior of the corresponding cooling device 230. Thus, the display apparatus 200 of this embodiment effectively prevents foreign matters forced by the airflow 234 from flowing into the interior of the display apparatus 200, such that the display apparatus 200 of the embodiment of the present invention complies with the dust-proof requirement of the safety standard. Moreover, because the cover 244 of the dust-proof device 240 is disposed on the body 242 of the dust-proof device 240, each second hole 244a of the cover 244 overlaps at least one of the first holes 242a of the body 242 and the dust-proof element 246 having a thickness t is disposed between the body 242 and the cover 244, the airflows 234 may flow into the interior of the display apparatus 200 along the path perpendicular to the arrangement direction of the second holes 244a and the path inclined to the arrangement direction of the second holes 244a. Therefore, the open ratio of the display apparatus 200 of this embodiment is higher, thus improving the intake air amount of the airflow.

Figure 7:
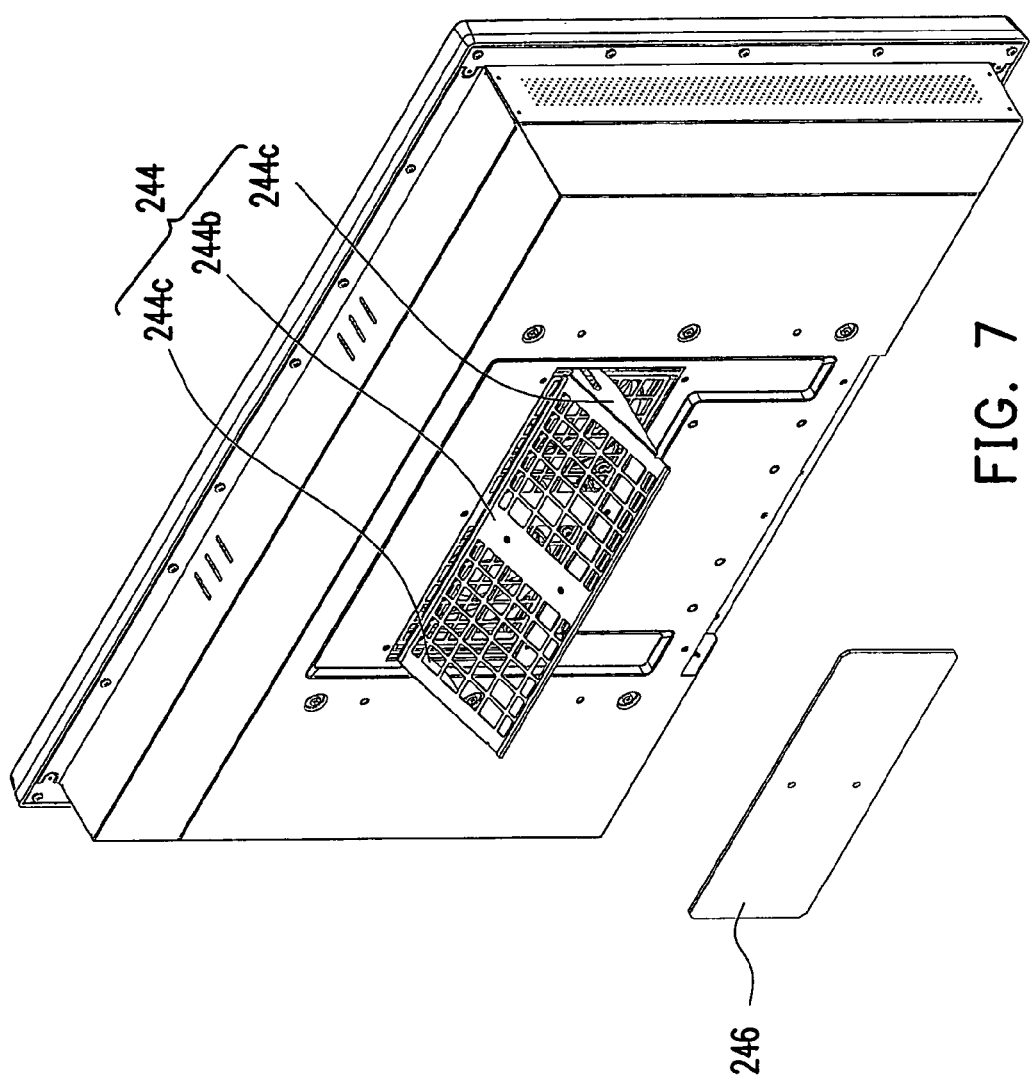
FIG. 7 is a schematic three-dimensional view of the dust-proof device of the display apparatus with a dust-proof element replaced according to this embodiment.

Hereinafter, the processes of replacing the dust-proof element 246 of the dust-proof device 240 of this embodiment are illustrated. FIG. 7 is a schematic three-dimensional view of the dust-proof device of the display apparatus with the dust-proof element replaced according to this embodiment. Referring to FIGS. 4 and 7, in this embodiment, when the user intends to replace the dust-proof element 246, the user first detaches the fixing elements 249 that fixed the second window frame portion 244b to the first window frame portion 242b. Then, the second window frame portion 244b of the cover 244 of the dust-proof device 240 rotates relative to the body 242 through the side boards 244c, such that the cover 244 is in an open state relative to the body 242. Then, the used dust-proof element 246 is taken out and another dust-proof element (not shown) is placed. Therefore, the manner of replacing the dust-proof element 246 of the dust-proof device 240 of this embodiment is relatively simple.

To sum up, the display apparatus of the embodiment of the present invention has one, a part of, or all of the following advantages.

1. The dust-proof device has the dust-proof element, so that the display apparatus of the embodiment effectively prevents the foreign matters forced by the airflow from flowing into the interior of the display apparatus and complies with the dust-proof requirement of the safety standard.

2. The cover of the dust-proof device is disposed on the body of the dust-proof device. Each second hole of the cover overlaps at least one of the first holes of the body. The dust-proof element is disposed between the body and the cover. Therefore, the open ratio of the display apparatus of the embodiment of the present invention is higher, thus improving the intake air amount of the airflow.

3. The second holes of the cover of the dust-proof device and the first holes form the interlaced holes, and the shortest distance between the two opposite edges of each interlaced hole is smaller than 12 mm. Therefore, the fingers of the user are not capable of reaching the interior of the display apparatus through the interlaced holes at will, such that the display apparatus of this embodiment complies with the requirement of the safety standard that the fingers of the user are prevented from reaching the interior of the display apparatus.

4. The dust-proof element of the dust-proof device is replaced by means of detaching the fixing element and then opening the cover, so that the manner of replacing the dust-proof element of the dust-proof device of this embodiment is relatively simple.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a casing, having a first opening and a second opening;
   a display module, disposed in the casing and having a display area and a non-display area, wherein the first opening exposes the display area, and the second opening is corresponding to the non-display area;
   a cooling device, disposed at the non-display area in the casing, wherein the cooling device comprises an air inlet corresponding to the second opening, and the cooling device is capable of producing an airflow; and
   a dust-proof device, comprising:
      a body, disposed at the non-display area in the casing, wherein the body comprises a plurality of first holes corresponding to the air inlet;
      a cover, disposed at the body, wherein the cover has a plurality of second holes, the second opening exposes the second holes, and each of the second holes overlaps at least one of the first holes; and
      a dust-proof element, disposed between the body and the cover, wherein the airflow flows through the second opening, the second holes, the dust-proof element, the first holes, and the air inlet to flow into an interior of the cooling device,
      wherein the cover and the body have a slide rail and a protrusion passing through the slide rail, so that the cover is slidably disposed at the body and is capable of rotating relative to the body.

2. The display apparatus according to claim 1, wherein the body further has a surface, the first holes are formed on the surface, each of the first holes is a rectangular hole, each of the second holes is a rectangular hole, orthogonal projections of the second holes on the surface and the first holes form a plurality of interlaced holes, and a shortest distance between two opposite edges of each of the interlaced holes is smaller than 12 mm.

3. The display apparatus according to claim 1, wherein the body comprises a first window frame portion and a ring portion, wherein the first holes are formed at the first window frame portion, the first window frame portion is connected to the ring portion, and the cooling device is located in the body.

4. The display apparatus according to claim 3, wherein the cover comprises a second window frame portion and two opposite side boards, the second holes are formed at the second window frame portion, the second window frame portion connects the side boards, each of the side boards is slidingly disposed at the ring portion, and the second window frame portion is capable of rotating relative to the body through the side boards.

5. The display apparatus according to claim 4, wherein the dust-proof device further comprises at least one fixing element and the second window frame portion is fixed on the first window frame portion through the fixing element.

6. The display apparatus according to claim 5, wherein the fixing element comprises a screw.

7. The display apparatus according to claim 1, wherein the cooling device comprises an axial fan.

8. The display apparatus according to claim 4, wherein the side boards of the cover have the slide rail, and the ring portion of the body has the protrusion.

* * * * *